United States Patent
Souchkov (10) Patent No.: US 8,149,605 B2
(45) Date of Patent: Apr. 3, 2012

(54) COMPACT AND ACCURATE ANALOG MEMORY FOR CMOS IMAGING PIXEL DETECTORS

(75) Inventor: Vitali Souchkov, Walnut Creek, CA (US)

(73) Assignee: NXP B.V., Eindhoven (NL)

( * ) Notice: Subject to any disclaimer, the term of this patent is extended or adjusted under 35 U.S.C. 154(b) by 144 days.

(21) Appl. No.: 12/744,931

(22) PCT Filed: Nov. 26, 2008

(86) PCT No.: PCT/IB2008/054964
§ 371 (c)(1),
(2), (4) Date: May 27, 2010

(87) PCT Pub. No.: WO2009/069085
PCT Pub. Date: Jun. 4, 2009

(65) Prior Publication Data
US 2010/0309703 A1 Dec. 9, 2010

Related U.S. Application Data

(60) Provisional application No. 60/990,793, filed on Nov. 28, 2007.

(51) Int. Cl.
*G11C 27/00* (2006.01)

(52) U.S. Cl. ............ 365/45; 365/72; 365/102; 365/104; 365/149

(58) Field of Classification Search ..................... 365/45, 365/72, 102, 104, 149
See application file for complete search history.

(56) References Cited

U.S. PATENT DOCUMENTS
5,144,525 A * 9/1992 Saxe et al. .................... 365/45
(Continued)

FOREIGN PATENT DOCUMENTS
EP 1 732 134 A1 12/2006
(Continued)

OTHER PUBLICATIONS

Stafford, K. R., et al. "A Complete Monolithic Sample/Hold Amplifier," IEEE J. of Solid-State Circuits, vol. SC-9, No. 6, pp. 381-387 (1974).
(Continued)

*Primary Examiner* — Pho M Luu (57) ABSTRACT

An analog memory circuit, i.e. a sample and hold circuit, wherein the source and the gate of the switching transistor is maintained at a same potential prior and after the sampling process using a transistor circuitry. The analog memory circuit comprises a memory capacitor (102) connected at a first end to a first port (104), which is connected a reference potential (106). A drain of a first transistor (108) —switch transistor—is connected to a second end of the memory capacitor (102). A source of the first transistor (108) is connected to a second port (110), which is connected to circuitry (112) for providing an input signal for storage in the memory capacitor (102), and a gate of the first transistor (108) is connected to a third port (114), which is connected to a first current sink (116). A source of a second transistor (118) is connected to the source of the first transistor (108) and a drain of the second transistor (118) is connected to the gate of the first transistor (108). The source of the first transistor (108) is connected to a source of a third transistor (120). A gate and a drain of the third transistor (120) are connected together to a gate of the second transistor (118) and to a fourth port (122), which is connected to a second current sink (124). According to the invention the feedthrough error is constant irrespective of the input signal level.

16 Claims, 5 Drawing Sheets

U.S. PATENT DOCUMENTS

| | | | |
|---|---|---|---|
| 5,384,570 A | | 1/1995 | Dedic |
| 5,805,492 A | * | 9/1998 | Gerna et al. ............... 365/45 |
| 5,828,592 A | * | 10/1998 | Tran et al. ............... 365/45 |
| 6,859,375 B2 | * | 2/2005 | Breton et al. ............... 365/45 |
| 2004/0036009 A1 | | 2/2004 | Takayanagi et al. |
| 2006/0049337 A1 | | 3/2006 | Waeny |

FOREIGN PATENT DOCUMENTS

GB 2 369 514 A 5/2002

OTHER PUBLICATIONS

McCreary, James, et al. "All-MOS Charge Redistribution Analog-to-Digital Conversion Techniques-Part 1", IEEE J. of Solid State Circuits, vol. SC-10; No. 6, pp. 371-379 (1975).

Nayebi, Mehrdad, et al. "A 10-Bit Video BiCMOS Track-and-Hold Amplifier," IEEE J. of Solid State Circuits, vol. 24, No. 6, pp. 1507-1516 (1989).

Lim, Peter, et al. "A High-Speed Sample-and-Hold Technique Using a Miller Hold Capacitance," IEEE J. of Solid State Circuits, vol. 26, No. 4, pp. 643-651 (1991).

Gatti, U., et al. "An Accurate CMOS Sample-and-Hold Circuit," IEEE J. of Solid State Circuits, vol. 27, No. 1, pp. 120-122 (1992).

Sone, Kazuya, et al. "A 10-b 100-Msample/S Pipelined Subranging BiCMOS ADC," IEEE J. of Solid State Circuits, vol. 28, No. 12, pp. 1180-1186 (1993).

Jones, David, et al. "Analog Integrated Circuits Design," John Wiley & Sons Inc., Ch. 8, p. 337 (1997).

International Search Report and Written Opinion for Int'l. Patent Appin. No. PCT/IB2008/054964 (Mar. 20, 2009).

* cited by examiner

COMPACT AND ACCURATE ANALOG MEMORY FOR CMOS IMAGING PIXEL DETECTORS

This invention relates generally to the field of CMOS imaging pixel detectors and more particularly to a compact and accurate analog memory for CMOS imaging pixel detectors. Complementary Metal Oxide Semiconductor (CMOS) imaging pixel detectors have dramatically improved in functionality and are now used to replace Charge Coupled Devices (CCD) imaging detectors. CMOS imaging pixel detectors have numerous advantages compared to CCD imaging detectors, which are: substantially reduced power consumption; reduced image lag; and, substantially reduced manufacturing costs. Furthermore, unlike CCD imaging detectors, CMOS imaging pixel detectors are capable of combining image acquisition and image processing within a same integrated circuit. Due to these advantages CMOS imaging detectors have become the technology of choice for many consumer applications and most significantly in the cell phone camera market and are increasingly used in numerous imaging applications such as, for example, digital radiography, ultra high speed image acquisition, and high resolution "smart" security cameras.

During image acquisition the electric charge released by a pixel photo detector due to light exposure is stored in a pixel memory element—capacitor—and then read out to a periphery of a pixel array comprising a plurality of pixel memory elements for further processing using, for example, a column read out architecture. The storage of the imaging information is usually combined with Correlated Double Sampling (CDS) to eliminate non-uniformities of the pixel array by sampling an electric charge from the pixel photo detector twice: prior and after the light exposure. To implement the storage function of Sample and Hold (S/H), circuitry equivalent to analog memory with memory element per pixel is commonly used. Commonly, a pixel memory element includes a MOS switch transistor connected to a capacitor. Accuracy of the information stored depends on the circuitry of the pixel memory element, which directly impacts various parameters of imaging systems such as contrast, resolution, and image parameter calibration. Pixel memory circuits also have to be very small due to the size of an image pixel—tens of micrometers—and the intension to use the largest possible portion of the image pixel area for the photo detectors.

Among the phenomena impacting the accuracy of CMOS analog memory elements injection of an electric charge from the digital switching into the memory capacitor is the most important. In a simple memory circuit—a switching transistor followed by a capacitor—the charge injected into the memory capacitor substantially depends on the analog signal itself.

In order to reduce the injection of the charge released by the memory switch into the memory capacitor a variety of circuit architectures have been developed as disclosed, for example, in:

K. R. Stafford, P. R. Gray, and R. A. Blanchard, IEEE J. of Solid State Circuits, V. 9, N 6, pp. 381-387, 1974;
K. Sone, Y. Nishida, and N. Nakadai, IEEE J. of Solid State Circuits, V. 28, N 12, pp. 1180-1186, 1993; and
P. Lim and B. Wooley, IEEE J. of Solid State Circuits, V. 26, N 4, pp. 643-651, 1991;
M. Nayebi and B. Wooley, IEEE J. of Solid State Circuits, V. 24, N 6, pp. 1507-1516, 1989; and,
U. Gatti, F. Maloberti, and G. Palmisano, IEEE J. of Solid State Circuits, V. 27, N 1, pp. 120-122, 1992.

These prior approaches employing additional switches, dummy memory capacitors, and high quality operational amplifiers. Unfortunately, the area required for implementing these circuits makes them unsuitable for use as in-pixel analog memories. A simpler circuit architecture that uses appropriately sized complementary switches or extra dummy switches with clock and inverted phase clock as disclosed in J. McGeary and P. Gray, IEEE J. of Solid State Circuits, V. 10, pp. 371-379, 1975, shows very limited performance unsuitable for use as high quality in-pixel analog memory.

It would be highly desirable to overcome these drawbacks and to provide a compact and accurate analog memory for CMOS imaging pixel detectors.

In accordance with the present invention there is provided an analog memory circuit wherein the source and the gate of the switching transistor are maintained at a same potential prior and after the sampling process using a transistor circuitry. The analog memory circuit comprises a memory capacitor connected at a first end to a first port, which is connected a reference potential. A drain of a first transistor—switch transistor—is connected to a second end of the memory capacitor. A source of the first transistor is connected to a second port, which is connected to circuitry for providing an input signal for storage in the memory capacitor, and a gate of the first transistor is connected to a third port, which is connected to a first current sink.

A source of a second transistor is connected to the source of the first transistor and a drain of the second transistor is connected to the gate of the first transistor. To the source of the first transistor is connected a source of a third transistor. A gate and a drain of the third transistor being connected together are connected to a gate of the second transistor and to a fourth port, which is connected to a second current sink.

In accordance with the present invention there is provided an analog memory circuit for performing CDS. The analog memory circuit comprises the same component as the analog memory circuit above plus additional circuitry for operating a second memory capacitor. The second memory capacitor is connected at a first end to the first port. A drain of a fourth transistor —switch transistor—is connected to a second end of the second memory capacitor, a source of the fourth transistor is connected to the second port, and a gate of the fourth transistor is connected to a fifth port, which is connected to a third current sink. A source of a fifth transistor is connected to the source of the fourth transistor, and a drain of the fifth transistor is connected to the gate of the fourth transistor. A source of the third transistor is connected to the source of the fourth transistor, and a gate of the fifth transistor is connected together with the gate of the second transistor and the gate and the drain of the third transistor to the fourth port.

In accordance with the present invention there is provided an analog memory circuit for performing CDS using one memory capacitor. The analog memory circuit comprises the same component as the analog memory circuit above plus additional circuitry for operating the memory capacitor at different reference potentials for sampling the input signal before and after exposure. A fourth transistor, having a drain connected to the first end of the memory capacitor, a source connected to a fifth port, which is connected to a second reference potential, and a gate connected to a sixth port, which is connected to a switch drive, is used to switch—in dependence upon a drive current controlled by the current sink—the first end of the memory capacitor between the two reference potentials for sampling the input signal provided by a source follower circuit before and after exposure of a photo detector.

Exemplary embodiments of the invention will now be described in conjunction with the following drawings, in which.

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

While the invention will be described for use with CMOS imaging pixel detectors, it will become apparent to those skilled in the art that the invention is not limited thereto but is also applicable for various other integrated circuits where accurate signal sampling using analog memory is beneficial.

In order to enable accurate sampling of an electric signal in an analog memory, for example, provided by a photo detector, a source and gate of a switching transistor used to control the sampling process are maintained at a same potential prior and after the sampling process using a simple and compact transistor circuitry according to the invention. Maintaining the source and gate of the switching transistor at same potential results in a signal independent release of electric charge from the switch transistor into the memory, enabling accurate sampling and obviating additional circuitry otherwise needed for calibration and nonlinear correction.

Figure 1:
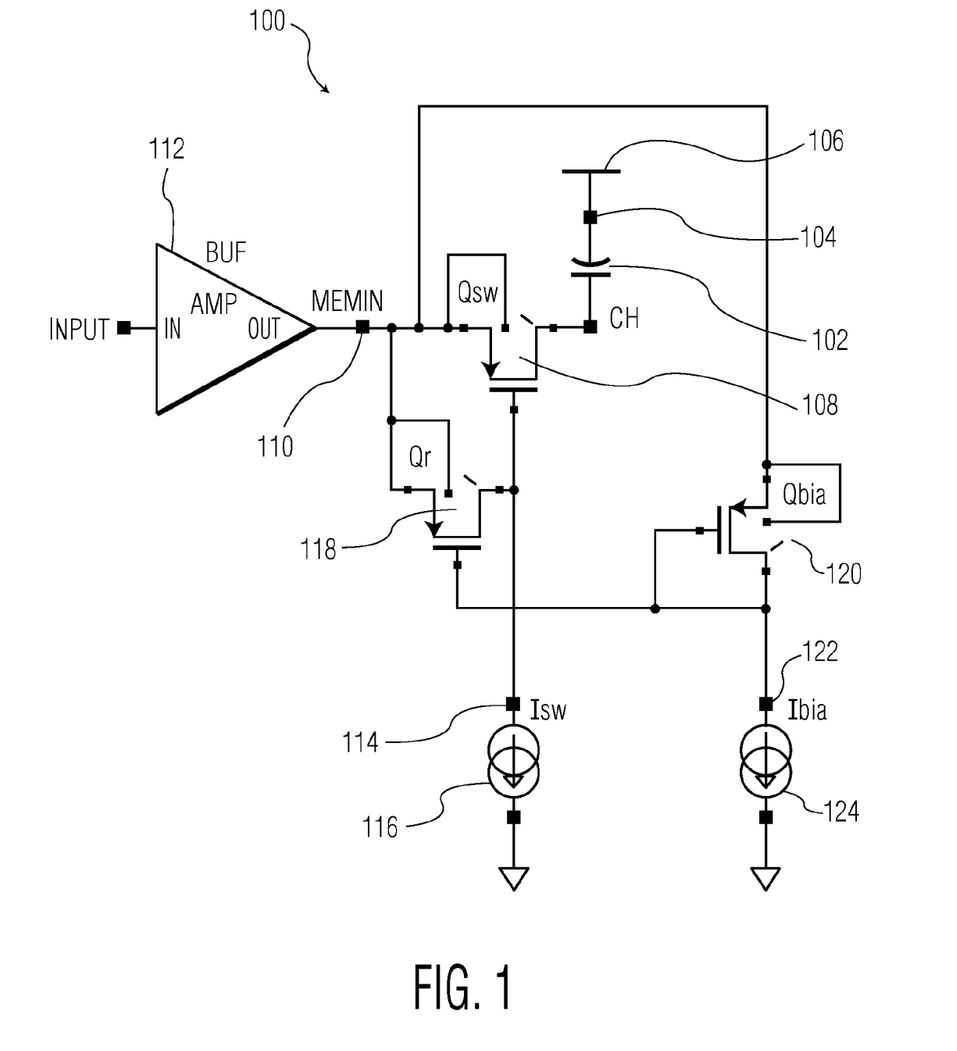
FIG. 1 is a simplified block diagram illustrating a first embodiment of an analog memory circuit according to the invention.

Referring to FIG. 1, a simplified block diagram of a first embodiment of an analog memory circuit 100 according to the invention is shown. A memory capacitor 102 is connected at a first end to a first port 104 connected to a reference potential 106. A first transistor 108—switch transistor—is connected to the second end of the memory capacitor 102 with its drain. A source of the first transistor is connected to a second port 110, which is connected to circuitry 112 for providing an input signal for storage in the memory capacitor 102. A gate of the first transistor 108 is connected to a third port 114, which is connected to a first current sink 116. The transistor circuitry for maintaining the source and the gate of the first transistor 108 at a same potential prior and after the sampling process comprises a second transistor 118—resistor transistor—and a third transistor 120—bias transistor. A source of the second transistor 118 is connected to the source of the first transistor 108, and a drain of the second transistor 118 is connected to the gate of the first transistor 108. A source of the third transistor 120 is connected to the source of the first transistor 108, and a gate and a drain of the third transistor is connected together to a gate of the second transistor 118 and to a fourth port 122, which is connected to a second current sink 124.

In operation, an input signal is provided by the circuitry 112 to the second port 110 of the analog memory circuit 100 at low impedance. The circuitry 112 is represented in FIG. 1 as a buffer having low output impedance for providing the signal to the analog memory circuit 100. The circuitry 112 is, for example, a source follower driven by a voltage change across a photo detector—for example, a photodiode or photo gate—having its electrode with changing potential connected to the source follower input port. To control the sampling process—start and stop of the sampling—the gate of the first transistor 108—the switch transistor—is driven by a current having, for example, amplitude in the range of a few hundred nano-Amperes, which is controlled by the current sink 116. The second transistor 118 functions as a resistor—having, for example, a few Mega Ohm resistance—that connects the source and the gate of the first transistor 108. In order to maintain a constant resistance between the source and the drain of the second transistor 118 an appropriate gate bias potential is supplied to the gate of the second transistor 118 using the third transistor 120—for example, equal in size to the second transistor 118—with its gate and drain connected together. The third transistor is biased by the current sink 124—having, for example, magnitude in the range of a few hundred nano-Amperes—while the source of the third transistor 120 is connected to the input port 110 for receiving the input signal. Therefore, the second transistor 118 and the third transistor 120 allow the gate potential of the second transistor 118 to follow the source potential variations of the first transistor 108, which represent the input signal provided to the memory capacitor 102. For example, the amplitude of the drive current of a few hundred nano-Amperes enable to switch the first transistor 108 in sampling mode when the second transistor 118 has a drain to source resistance of a few Mega Ohm.

Figure 2:
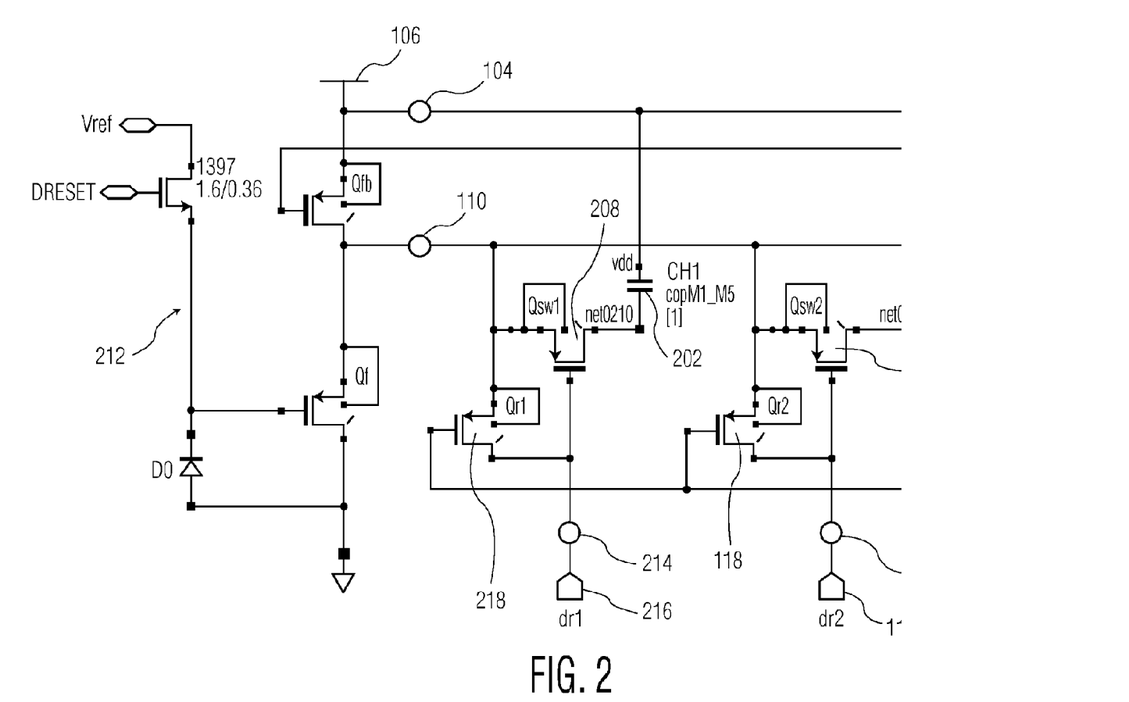
FIG. 2 is a simplified block diagram illustrating a second embodiment of an analog memory circuit according to the invention.

Referring to FIG. 2, a simplified block diagram of a second embodiment of an analog memory circuit 200 according to the invention is shown—with same components as shown in FIG. 1 being indicated using same reference numerals. The analog memory circuit 200 is designed for performing CDS, i.e. sampling an input signal before exposure of the photo detector and after exposure of the photo detector. Here, the analog memory circuit 200 comprises the same components as the analog memory circuitry 100 shown in FIG. 1, plus additional circuitry for operating a second memory capacitor 202. The second memory capacitor 202 is connected at a first end to the first port 104.

A fourth transistor 208—switch transistor—is connected to the second end of the second memory capacitor 202 with its drain. A source of the fourth transistor 208 is connected to the second port 110, which is connected to circuitry 212 for providing an input signal for storage in the memory capacitors 102 and 202. A gate of the fourth transistor 208 is connected to a fifth port 214, which is connected to a third current sink 216. The transistor circuitry for maintaining the source and the gate of the fourth transistor 208 at a same potential prior and after the sampling process comprises a fifth transistor 218—resistor transistor—and the third transistor 120—bias transistor. A source of the fifth transistor 218 is connected to the source of the fourth transistor 208, and a drain of the fifth transistor 218 is connected to the gate of the fourth transistor 208. A source of the third transistor 120 is connected to the source of the fourth transistor 208, and a gate of the fifth transistor 218 is connected together with the gate of the second transistor 118 and gate and the drain of the third transistor 120 to the fourth port 122. In operation, the transistor circuitries for maintaining the source and the gate of the first transistor 108 and the fourth transistor 208 are at a same potential function in a similar fashion as described above with respect to the analog memory circuit 100. In particular, when the memory capacitor 102 is used for sampling the first transistor 108 is switched in sampling mode and the source and the gate of the first transistor 108 are maintained at a same potential prior and after the sampling using the second transistor 118 and the third transistor 120, and when the second memory capacitor 202 is used for sampling the fourth transistor 208 is switched in sampling mode and the source and the gate of the fourth transistor 208 are maintained at a same potential prior and after the sampling using the fifth transistor 218 and the third transistor 120.

The input signal is sampled before exposure—after resetting the photo diode D0 of the source follower 212 to reference potential—using the second memory capacitor 202, and after exposure using the memory capacitor 102. Sampling drive currents are applied via the third current sink 216 for sampling before exposure and the first current sink 116 for sampling after exposure. The circuit 212 is a typical source follower circuit well known in the art of imaging pixel detectors.

Figure 3:
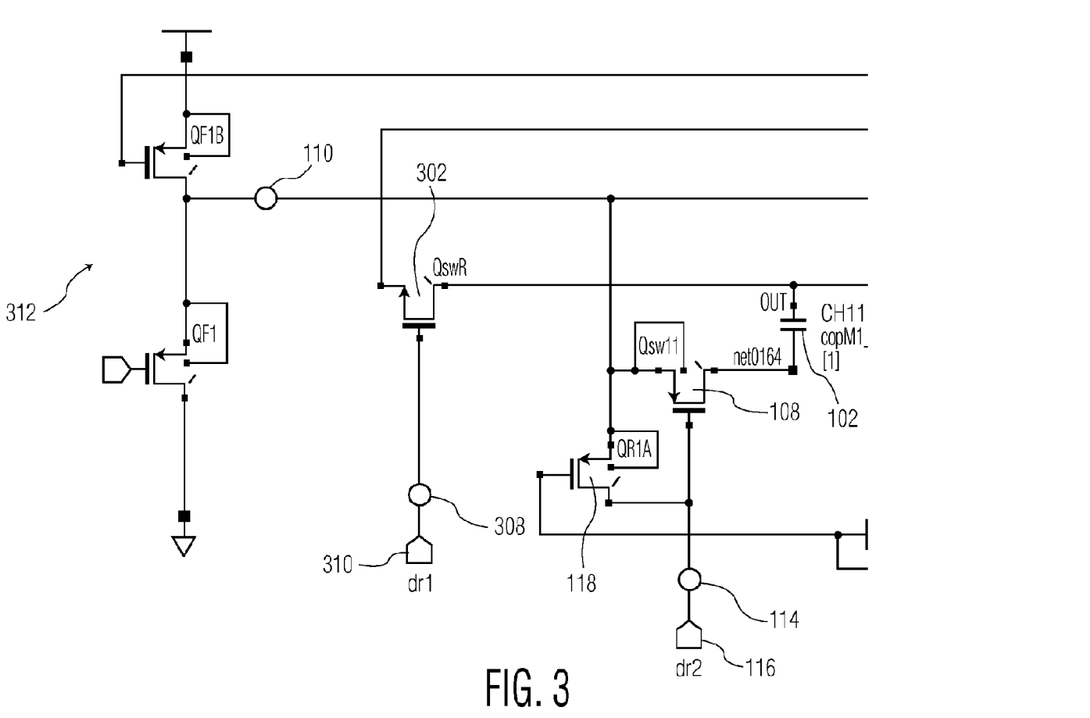
FIG. 3 is a simplified block diagram illustrating a third embodiment of an analog memory circuit according to the invention.

Referring to FIG. 3, a simplified block diagram of a third embodiment of an analog memory circuit 300 according to the invention is shown—with same components as shown in FIG. 1 being indicated using same reference numerals. Again, the analog memory circuit 300 is designed for performing CDS, i.e. sampling an input signal before exposure of the photo detector and after exposure of the photo detector. Here, the analog memory circuit 300 comprises the same components as the analog memory circuitry 100 shown in FIG. 1, plus additional circuitry for operating the memory capacitor 102 at different reference potentials for sampling the input signal before and after exposure. A fourth transistor 302, having a drain connected to the first end of the memory capacitor 102, a source connected to a fifth port 304, which is connected to a second reference potential 306, and a gate connected to a sixth port 308, which is connected to a clock drive 310, is used to switch—in dependence upon a drive voltage controlled by the clock drive 310—the first end of the memory capacitor 102 between two reference potentials for sampling the input signal provided by source follower circuit 312 before and after exposure of the photo detector.

Knowledge of system requirements of including but not limited to input impedance, reference potentials, and drive currents, makes possible the design various embodiments of the analog memory circuit according to the invention on a signal processor by executing commands based on the above description stored on a storage medium.

Numerous modifications to the disclosed embodiments will be readily apparent to those skilled in the art, and the general principles defined herein may be applied to other embodiments and applications without departing from the scope of the invention when n-well PMOS transistors are replaced p-well NMOS transistors designed using n-substrate or p-wells grown in n-well. Thus, the present invention is not intended to be limited to the embodiments disclosed that based on PMOS transistors, but is to be accorded with using NMOS transistors within different technological environments that are consistent with the principles and features disclosed herein.

Figure 4:
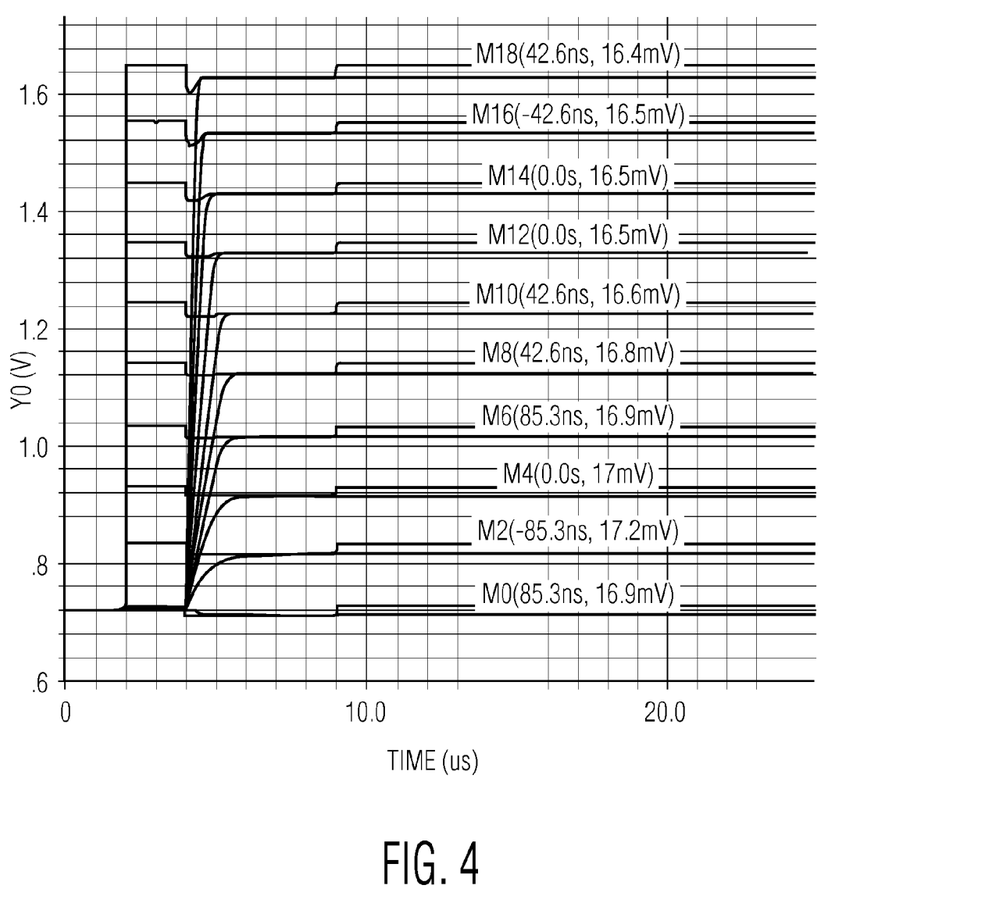
FIG. 4 is a simplified diagram illustrating simulated signal development during sampling using the analog memory circuit according to the invention.

FIG. 4 illustrates signal development during sampling using the analog memory circuit according to the invention for an imaging pixel designed in CMOS technology with 0.18 µm design feature. Sampling duration is 5 µs starting at 4 µs. After the switch transistor is opened for sampling the stored voltage is compared to the voltage provided to the analog memory circuit.

Figure 5:
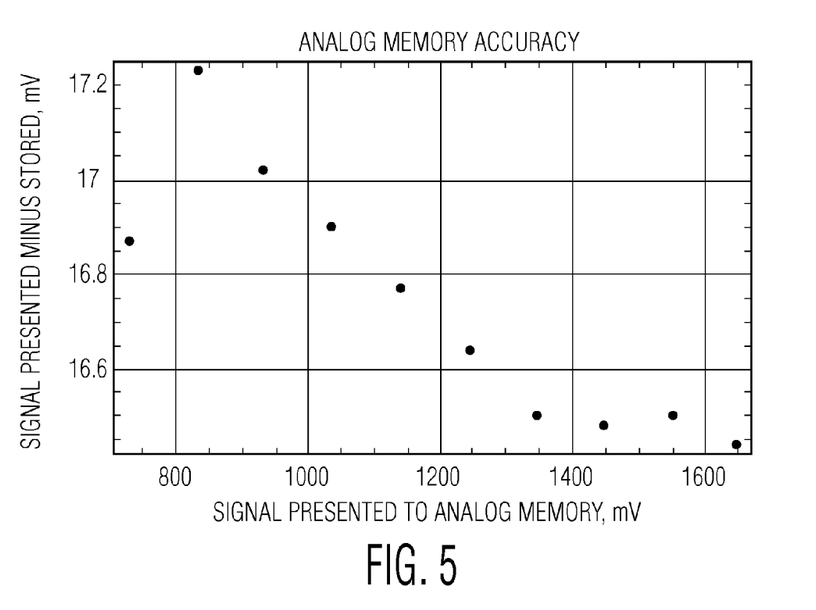
FIG. 5 is a simplified diagram illustrating the deviation of the stored signal from the signal provided to the analog memory circuit according to the invention; and, FIG. 6 is a simplified block diagram illustrating a comparison of the accuracy of the analog memory circuit according to the invention with conventional analog memory circuit.

FIG. 5 illustrates the deviation of the stored signal from the signal provided to the analog memory circuit over a range of the signal amplitude of 900 mV. The result demonstrates that the deviation of the stored signal from the signal provided to the analog memory circuit is less than the least significant bit when using a digitizer with 11 bit conversion range.

Figure 6:
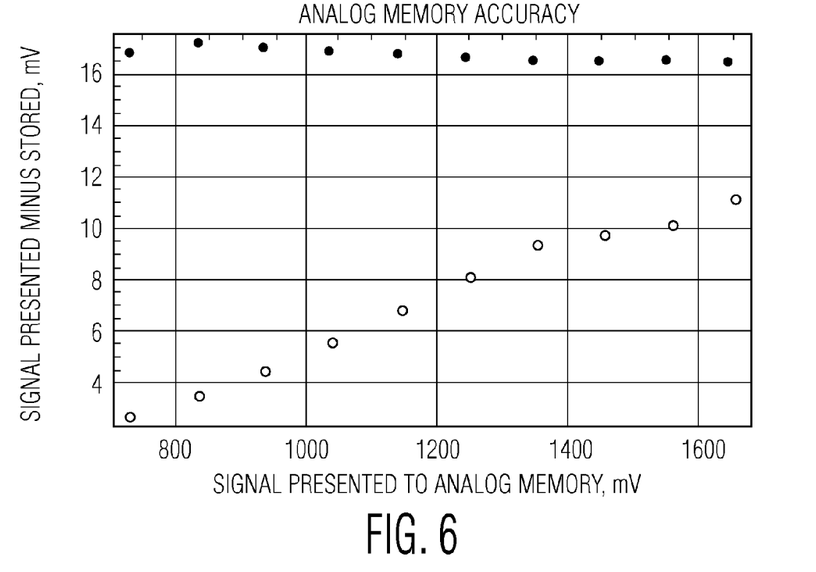

FIG. 6 illustrates a comparison of the accuracy of the analog memory circuit according to the invention—upper dotted curve—with an analog memory circuit having a same switching transistor absent the transistor circuitry for maintaining the source and the gate of the switching transistor at a same potential during the sampling process—lower dotted curve. From FIG. 6 it is evident that the analog memory circuit according to the invention is approximately 15 times more accurate.

The above embodiments of an analog memory circuit according to the invention are highly beneficial by allowing correlated sampling in imaging pixel detectors with 11 bit resolution over a 900 mV range of signal variation absent additional circuitry for calibration and nonlinear correction while maintaining power dissipation at approximately 10 nW per memory element. Thus, the analog memory circuit according to the invention has a substantially better performance compared to state of the art analog memory circuits whilst offering a compact circuit design using simple NMOS transistors. The design approach according to embodiments of the invention allowing the integration of a plurality of analog memory circuits together with photo detectors and source followers on a single chip in a variety of applications such as, for example, CMOS imaging pixel detectors and other circuits providing high quality of signal processing while area available for the circuitry is minimized.

Numerous other embodiments of the invention will be apparent to persons skilled in the art without departing from the spirit and scope of the invention as defined in the appended claims.

What is claimed is:

1. An analog memory circuit comprising:
a memory capacitor connected at a first end to a first port, the first port for being connected to a reference potential;
a first transistor, a drain of the first transistor being connected to a second end of the memory capacitor, a source of the first transistor being connected to a second port, the second port for being connected to circuitry for providing an input signal for storage in the memory capacitor, and a gate of the first transistor being connected to a third port, the third port for being connected to a first current sink;
a second transistor, a source of the second transistor being connected to the source of the first transistor and a drain of the second transistor being connected to the gate of the first transistor; and,
a third transistor, a source of the third transistor being connected to the source of the first transistor, a gate and a drain of the third transistor being connected together to a gate of the second transistor and to a fourth port, the fourth port for being connected to a second current sink.

2. An analog memory circuit as in claim 1 comprising:
a fourth transistor, a drain of the fourth transistor being connected to the first end of the memory capacitor, a source of the fourth transistor being connected to a fifth port, the fifth port for being connected to a second reference potential, and a gate of the fourth transistor being connected to a sixth port, the sixth port for being connected to a voltage clock drive.

3. An analog memory circuit as in claim 1 characterized in that the second and the third transistors are designed such that in operation the source and the gate of the first transistor are at substantially equal potential when the first transistor is in an open state for receiving the input signal and providing the same to the memory capacitor for storage therein.

4. An analog memory circuit as in claim 3 characterized in that the second and the third transistors are designed such that in operation a gate potential of the second transistor follows a source potential of the first transistor, the source potential varying in dependence upon the input signal.

5. An analog memory circuit as in claim 4 characterized in that the second and the third transistors are designed such that in operation a drain to source resistance of the second transistor is kept substantially constant.

6. An analog memory circuit as in claim 5 characterized in that the second and the third transistors are designed such that in operation the third transistor provides a gate bias potential such that the drain to source resistance of the second transistor is kept substantially constant.

7. An analog memory circuit as in claim 6 characterized in that the second and the third transistors are substantially equal in size.

8. An analog memory circuit as in claim 1, further comprising:
- a second memory capacitor connected at a first end to the first port;
- a fourth transistor, a drain of the fourth transistor being connected to a second end of the second memory capacitor, a source of the fourth transistor being connected to the second port, and a gate of the fourth transistor being connected to a fifth port, the fifth port for being connected to a third current sink; and,
- a fifth transistor, a source of the fifth transistor being connected to the source of the fourth transistor, a drain of the fifth transistor being connected to the gate of the fourth transistor, and a gate of the fifth transistor being connected together with the gate of the second transistor and the drain of the third transistor to the fourth port.

9. An analog memory circuit as in claim 8 characterized in that the second and the third transistors are designed such that in operation the source and the gate of the first transistor are at substantially equal potential when the first transistor is in an open state for receiving the input signal and providing the same to the memory capacitor for storage therein, and wherein the fifth and the third transistors are designed such that in operation the source and the gate of the fourth transistor are at substantially equal potential when the fourth transistor is in an open state for receiving the input signal and providing the same to the second memory capacitor for storage therein.

10. An analog memory circuit as in claim 9 characterized in that the second port is connected to a source follower circuitry, and wherein in operation the analog memory circuit performs correlated double sampling.

11. An analog memory circuit as in claim 1 characterized in that the analog memory circuit and the source follower are integrated on a complementary metal-oxide-semiconductor chip.

12. An analog memory circuit as in claim 11 characterized in that the analog memory circuit comprises at least one of NMOS and PMOS components.

13. An analog memory circuit as in claim 11 characterized in that the complementary metal-oxide-semiconductor chip is an imaging pixel detector.

14. A storage medium having stored therein executable commands for execution on a processor, the executable commands for when executed resulting in an integrated circuit design of an analog memory circuit comprising:
- a memory capacitor connected at a first end to a first port, the first port for being connected to a reference potential;
- a first transistor, a drain of the first transistor being connected to a second end of the memory capacitor, a source of the first transistor being connected to a second port, the second port for being connected to circuitry for providing an input signal for storage in the memory capacitor, and a gate of the first transistor being connected to a third port, the third port for being connected to a first current sink;
- a second transistor, a source of the second transistor being connected to the source of the first transistor and a drain of the second transistor being connected to the gate of the first transistor; and,
- a third transistor, a source of the third transistor being connected to the source of the first transistor, a gate and a drain of the third transistor being connected together to a gate of the second transistor and to a fourth port, the fourth port for being connected to a second current sink.

15. A storage medium having stored therein executable commands for execution on a processor, the executable commands for when executed resulting in an integrated circuit design of an analog memory circuit as in claim 14 comprising:
- a second memory capacitor connected at a first end to the first port;
- a fourth transistor, a drain of the fourth transistor being connected to a second end of the second memory capacitor, a source of the fourth transistor being connected to the second port, and a gate of the fourth transistor being connected to a fifth port, the fifth port for being connected to a third current sink; and,
- a fifth transistor, a source of the fifth transistor being connected to the source of the fourth transistor, a drain of the fifth transistor being connected to the gate of the fourth transistor, and a gate of the fifth transistor being connected together with the gate of the second transistor and the drain of the third transistor to the fourth port.

16. A storage medium having stored therein executable commands for execution on a processor, the executable commands for when executed resulting in an integrated circuit design of an analog memory circuit as defined in claim 14 comprising:
- a fourth transistor, a drain of the fourth transistor being connected to the first end of the memory capacitor, a source of the fourth transistor being connected to a fifth port, the fifth port for being connected to a second reference potential, and a gate of the fourth transistor being connected to a sixth port, the sixth port for being connected to a voltage clock drive.

* * * * *